(12) United States Patent
Karabiyik et al.

(10) Patent No.: US 10,580,924 B2
(45) Date of Patent: Mar. 3, 2020

(54) GRAPHENE DEVICES FOR TERAHERTZ DETECTION AND EMISSION

(71) Applicants: Mustafa Karabiyik, Miami, FL (US); Nezih Pala, Fort Lauderdale, FL (US)

(72) Inventors: Mustafa Karabiyik, Miami, FL (US); Nezih Pala, Fort Lauderdale, FL (US)

(73) Assignee: The Florida International University Board of Trustees, Miami, FL (US)

( * ) Notice: Subject to any disclaimer, the term of this patent is extended or adjusted under 35 U.S.C. 154(b) by 0 days.

(21) Appl. No.: 16/288,748

(22) Filed: Feb. 28, 2019

(65) Prior Publication Data

US 2019/0312171 A1 Oct. 10, 2019

Related U.S. Application Data

(60) Provisional application No. 62/652,663, filed on Apr. 4, 2018.

(51) Int. Cl.
| | | |
|---|---|---|
| *H01L 31/11* | (2006.01) | |
| *H01L 31/02* | (2006.01) | |
| *H01L 31/113* | (2006.01) | |
| *H01L 31/028* | (2006.01) | |
| *H01L 31/0224* | (2006.01) | |
| *H01L 29/16* | (2006.01) | |

(52) U.S. Cl.
CPC ........ *H01L 31/1136* (2013.01); *H01L 31/028* (2013.01); *H01L 31/022408* (2013.01); *H01L 29/1606* (2013.01)

(58) Field of Classification Search
CPC ......... H01L 31/1136; H01L 31/022408; H01L 31/028; H01L 29/1606

USPC .......................................................... 257/29
See application file for complete search history.

(56) References Cited

U.S. PATENT DOCUMENTS

| | | | | |
|---|---|---|---|---|
| 9,105,791 | B1* | 8/2015 | Dyer | H01L 31/1127 |
| 9,293,627 | B1* | 3/2016 | Beechem, III | H01L 29/1606 |
| 2007/0045756 | A1* | 3/2007 | Chang | B82Y 10/00 257/414 |
| 2009/0032804 | A1* | 2/2009 | Kalburge | B82Y 10/00 257/24 |
| 2009/0079040 | A1* | 3/2009 | Schultz | H01L 21/02381 257/632 |
| 2010/0017922 | A1* | 1/2010 | Shin | B82Y 20/00 850/21 |
| 2010/0051897 | A1* | 3/2010 | Chen | B82Y 10/00 257/9 |
| 2011/0147715 | A1* | 6/2011 | Rogers | B82Y 10/00 257/24 |

(Continued)

FOREIGN PATENT DOCUMENTS

CN 104916732 9/2015

*Primary Examiner* — Sheikh Maruf
(74) *Attorney, Agent, or Firm* — Saliwanchik, Lloyd & Eisenschenk

(57) ABSTRACT

Devices and methods for Terahertz (THz) sensing/detection, imaging, spectroscopy, and communication are provided. A graphene-based field effect transistor (FET) can have a quality factor of greater than 400 and a responsivity of at least 400 Volts per Watt. A FET sensor can include a substrate, a gate disposed on the substrate, an insulation layer disposed on the gate and the substrate, a source terminal and a drain terminal disposed on the substrate, and a graphene layer disposed on the insulation layer.

20 Claims, 5 Drawing Sheets

(56) References Cited

U.S. PATENT DOCUMENTS

| | | | |
|---|---|---|---|
| 2011/0175060 A1* | 7/2011 | Okai | B82Y 40/00 |
| | | | 257/29 |
| 2012/0056161 A1* | 3/2012 | Avouris | H01L 29/1606 |
| | | | 257/24 |
| 2013/0048950 A1* | 2/2013 | Levy | B82Y 10/00 |
| | | | 257/29 |
| 2015/0109606 A1* | 4/2015 | Peale | H01L 31/1136 |
| | | | 356/30 |
| 2015/0214041 A1* | 7/2015 | Hanaoka | H01L 29/7869 |
| | | | 438/762 |
| 2015/0318401 A1* | 11/2015 | Duan | H01L 29/66742 |
| | | | 250/200 |
| 2015/0357504 A1* | 12/2015 | Chen | H01L 31/028 |
| | | | 257/27 |
| 2015/0364508 A1* | 12/2015 | Le Bars | H01L 31/1136 |
| | | | 250/338.4 |
| 2016/0005894 A1* | 1/2016 | Zhang | B82Y 40/00 |
| | | | 257/29 |
| 2016/0305823 A1* | 10/2016 | Ignjatovic | G01J 5/0837 |
| 2017/0236957 A1* | 8/2017 | Allen | H01L 31/1129 |
| | | | 257/194 |
| 2017/0256667 A1* | 9/2017 | Lee | H01L 31/1136 |
| 2018/0164698 A1* | 6/2018 | Yang | G03F 7/70633 |

* cited by examiner

GRAPHENE DEVICES FOR TERAHERTZ DETECTION AND EMISSION

CROSS REFERENCE TO RELATED APPLICATION

This application claims the benefit of U.S. Provisional Application Ser. No. 62/652,663, filed Apr. 4, 2018, the disclosure of which is hereby incorporated by reference in its entirety, including all figures, tables, and drawings.

STATEMENT OF GOVERNMENT SUPPORT

This invention was made with government support under Grant No. W911NF-12-2-0023 awarded by the Army Research Laboratory Multiscale Multidisciplinary Modeling of Electronic Materials Collaborative Research Alliance. The government has certain rights in the invention.

BACKGROUND

Terahertz (THz) devices are designed to operate from 0.1-10 THz. The THz spectrum has unique properties such as penetration through soft materials and reflecting from hard materials, which make THz technology a prime candidate for imaging. Plasmons are longitudinal charge oscillations in carrier rich materials. Plasmons can be excited in transistors and can induce a DC voltage between the source-drain when certain necessary conditions are satisfied. U.S. Pat. No. 9,105,791 and CN 104916732A describe THz devices.

BRIEF SUMMARY

Embodiments of the subject invention provide devices and methods for Terahertz (THz) sensing/detection, THz imaging, THz spectroscopy, and THz communication using graphene-based field effect transistors (FETs). For example, a free standing graphene-based flipped FET can have a quality factor of greater than 400 (i.e., Q>400) and a responsivity of 400 Volts per Watt (V/W), about 400 V/W, or at least 400 W/V. This quality factor is up to 50 times higher than the quality factor results that have been reported for GaN detectors, and the demonstrated responsivity is 10,000 times higher than previously reported graphene detector values for responsivity. Such an FET can be used for, e.g., resonant room temperature THz detection.

THz detectors can also allow "seeing" behind walls. Medical imaging for dental and skin care is another field of potential applications. The detectors described herein can make compact on-chip THz spectroscopy systems possible, which can be used for detection and identification of biochemical substances, such as disease biomarkers, illicit drugs, and improvised explosives. Hence, there are numerous applications in the government, medical, and pharmaceutical industries, as well as for scientific research institutions.

In an embodiment, a terahertz sensor can comprise: a substrate; a gate disposed on the substrate; an insulation layer disposed on the gate and the substrate; a source terminal and a drain terminal disposed on the substrate; and a graphene layer disposed on the insulation layer. The graphene layer can be in direct physical contact with the insulation layer. The insulation layer can comprise an air gap, though this is not required. The graphene layer can be in direct physical contact with the insulation layer at (at least) a portion thereof disposed directly over the gate, and the graphene layer can be disposed over the air gap (if present) at a portion of the graphene layer that is not disposed over the gate. The graphene layer can also be in direct physical contact with at least one of the source terminal and the drain terminal (e.g., on a top surface thereof or between the respective terminal and the substrate).

In another embodiment, a terahertz sensor can comprise: a substrate; a plurality of gates disposed on the substrate; an insulation layer disposed on the plurality of gates and the substrate; a source terminal and a drain terminal disposed on the substrate; and a graphene layer disposed on the insulation layer over each gate of the plurality of gates. The graphene layer can be in direct physical contact with the insulation layer. The insulation layer can comprise a plurality of air gaps, though this is not required. The graphene layer can be in direct physical contact with the insulation layer at (at least) portions thereof disposed directly over the gates of the plurality of gates, and the graphene layer can be disposed over the air gaps of the plurality of air gaps (if present) at portions of the graphene layer that are not disposed over any gate of the plurality of gates. The graphene layer can also be in direct physical contact with at least one of the source terminal and the drain terminal (e.g., on a top surface thereof or between the respective terminal and the substrate).

DETAILED DESCRIPTION

Embodiments of the subject invention provide devices and methods for Terahertz (THz) sensing/detection, THz imaging, THz spectroscopy, and THz communication using graphene-based field effect transistors (FETs). For example, a free standing graphene-based flipped FET can have a quality factor of greater than 400 (i.e., Q>400) and a responsivity of 400 Volts per Watt (V/W), about 400 V/W, or at least 400 W/V. This quality factor is up to 50 times higher than the quality factor results that have been reported for GaN detectors, and the demonstrated responsivity is 10,000 times higher than previously reported graphene detector values for responsivity. Such an FET can be used for, e.g., resonant room temperature THz detection.

The devices and methods described herein can be used for THz imaging, THz spectroscopy, and THz communication.

Example applications include dental imaging, skin imaging, human/luggage/package security screening for concealed objects, short distance ultra-fast communication, and material/chemical detection and identification. THz sensing and emission are important applications of embodiments of the subject invention.

Figure 1A:
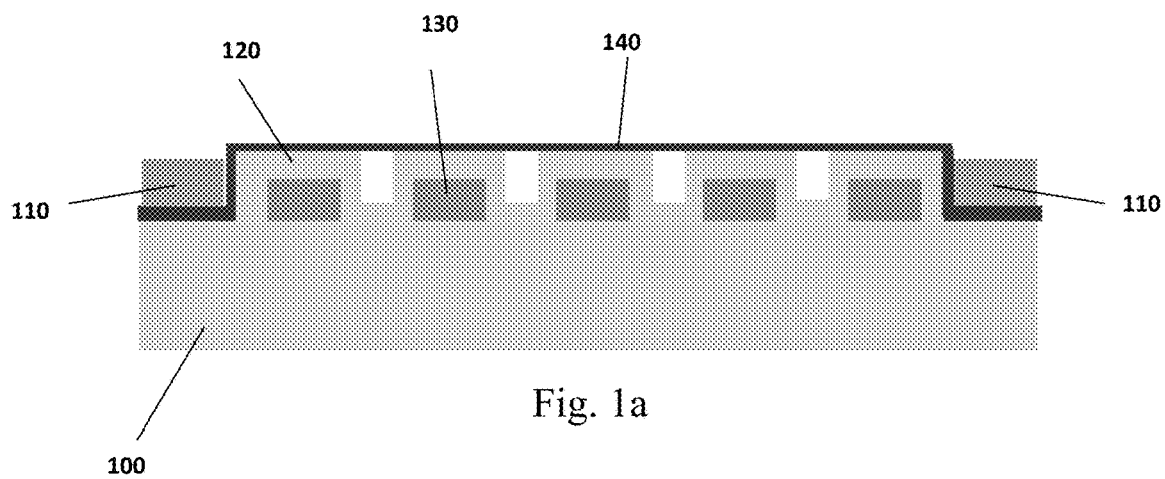
FIG. 1a shows a cross-sectional diagram of a field effect transistor according to an embodiment of the subject invention.
Figure 1B:
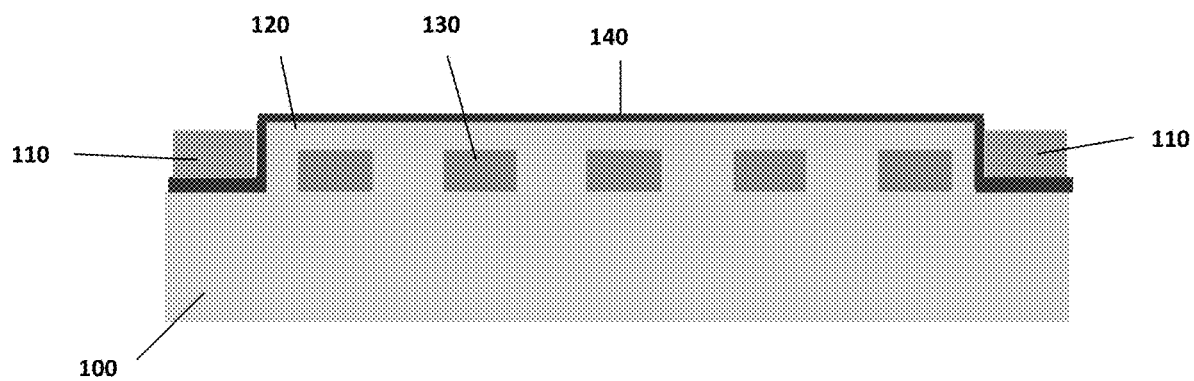
FIG. 1b shows a cross-sectional diagram of a field effect transistor according to an embodiment of the subject invention.
Figure 1C:
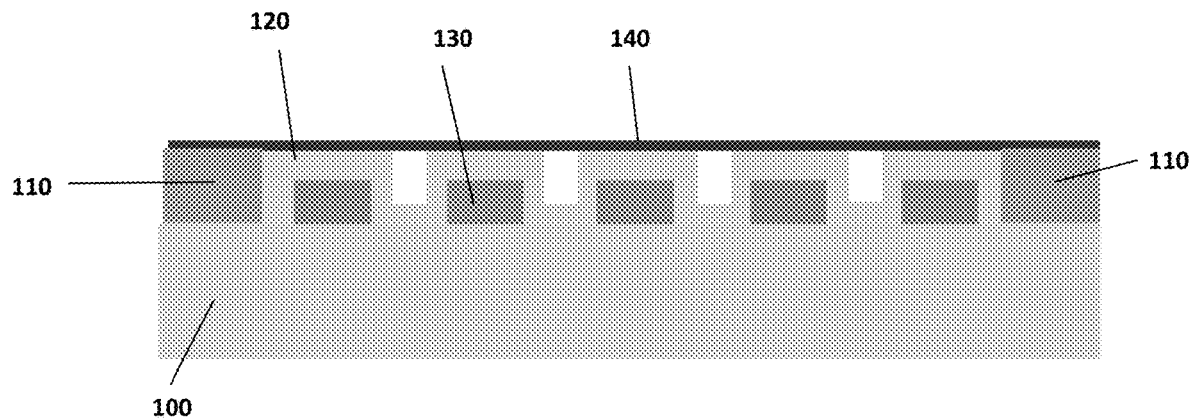
FIG. 1c shows a cross-sectional diagram of a field effect transistor according to an embodiment of the subject invention.
Figure 1D:
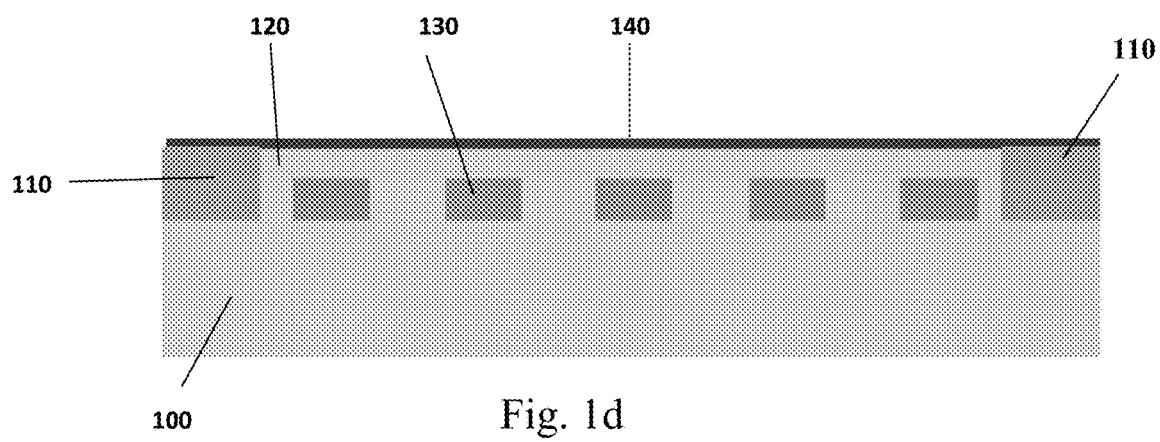
FIG. 1d shows a cross-sectional diagram of a field effect transistor according to an embodiment of the subject invention.

FIGS. 1a-1d show different structures of FETs of embodiments of the subject invention. Referring to FIGS. 1a-1d, a series of gates 130 can be deposited on a substrate 100. An oxide layer 120 can be formed on the gates 130 and the substrate 100. Source and drain terminals 110 can be formed on the substrate 100. A graphene layer 140 can be formed on the oxide layer 120. As seen in FIGS. 1a and 1c, the oxide layer 120 can contain air gaps between the gates 130, thereby permitting the graphene layer 140 to be suspended over the air gaps, though as seen in FIGS. 1b and 1d these air gaps are not necessary and some embodiments may exclude them. The graphene layer 140 can be formed in between the source and drain terminals 110 and the substrate 100, as seen in FIGS. 1a and 1b, or on a top surface of the source and drain terminals 110, as seen in FIGS. 1c and 1d.

Figure 2:
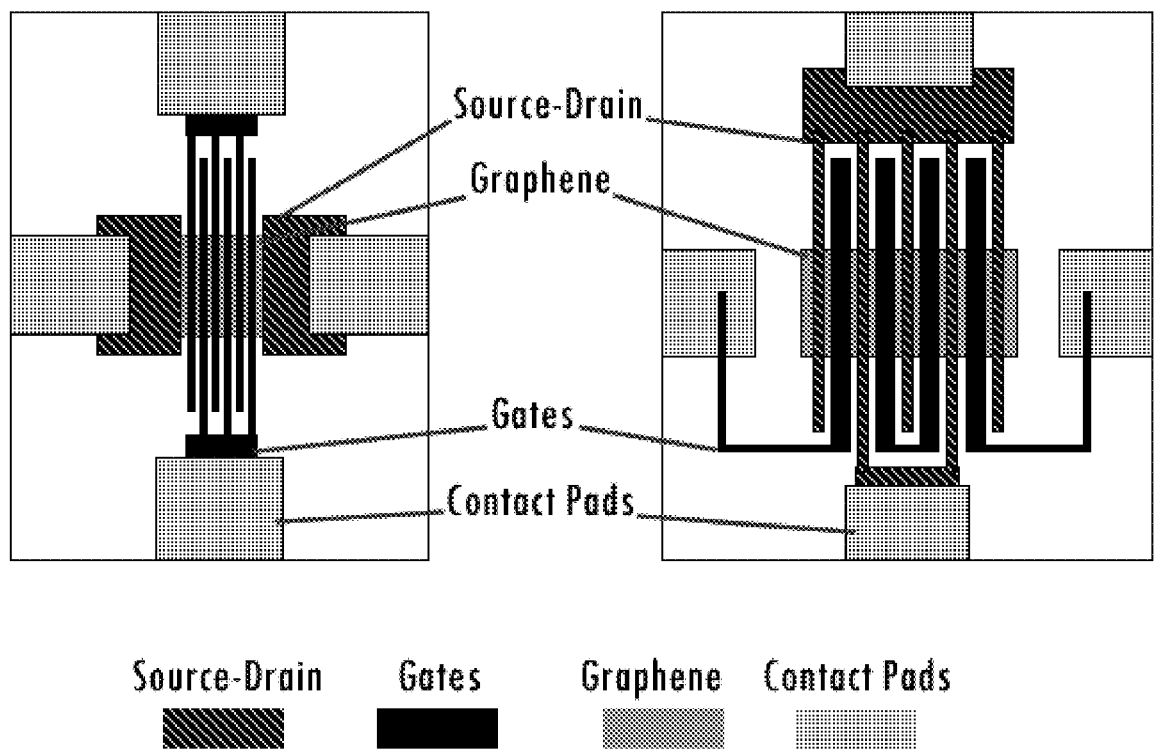
FIG. 2 shows two circuit layout diagrams of linear grating gate field effect transistors according to embodiments of the subject invention.
Figure 3:
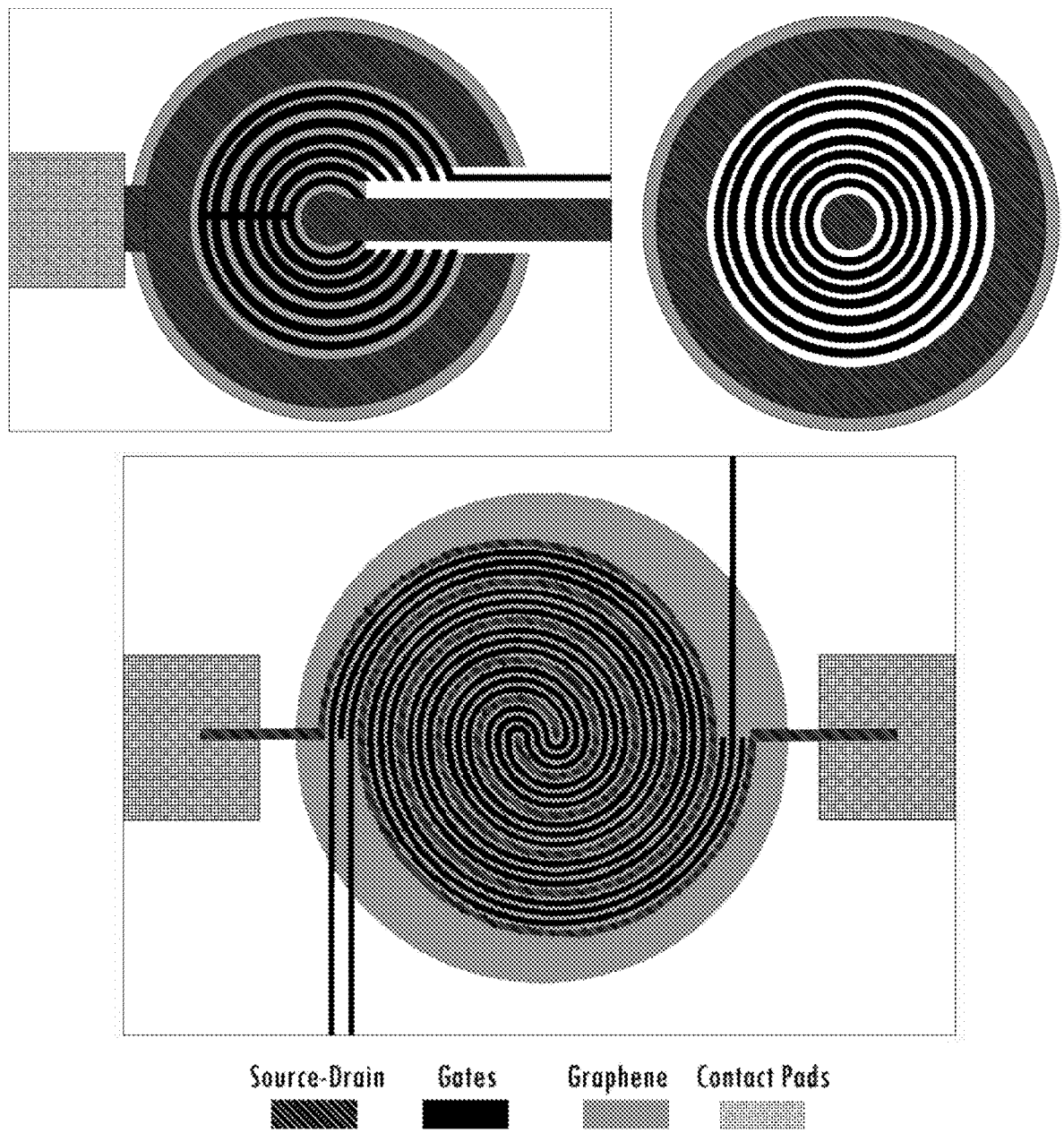
FIG. 3 shows three circuit layout diagrams of circular grating gate field effect transistors according to embodiments of the subject invention.
Figure 4:
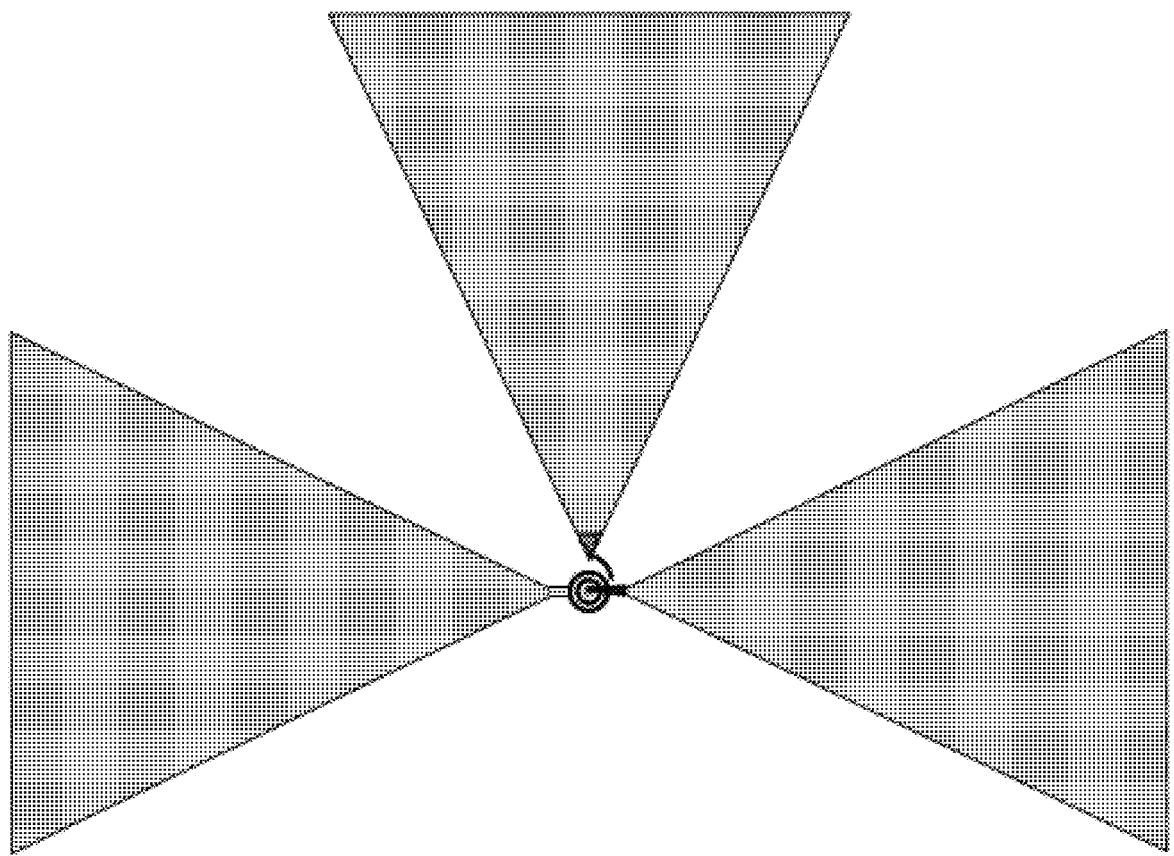
FIG. 4 is a diagram of pads and antennas for a field effect transistor according to an embodiment of the subject invention.

FIG. 2 shows top views of two circuit layout diagrams of linear grating gate FETs of embodiments of the subject invention, and FIG. 3 shows top views of three circuit layout diagrams of circular grating gate FETs of embodiments of the subject invention. The graphene is shown with cross-hatching and does not cover the entire image in these figures. The source/drain, gates, contact pads, and graphene are depicted in each image in FIGS. 2 and 3. FIG. 4 shows a top view diagram of pads and antennas for an FET of an embodiment of the subject invention. The FET of FIG. 4 uses circular grating for the gates.

In order to realize potential applications of THz electromagnetic waves, tunable, highly sensitive detectors operating at room temperature are needed. Plasmonic THz detectors can be based on excitation of plasmons in high charge carrier density interfaces or materials such as graphene. In order to excite strong THz plasmons, a grating gate can be used to compensate for the momentum of the incoming radiation. Fabrication of such devices with gate electrodes requires an insulating dielectric layer between the channel and the gate, which causes the graphene to be disposed between the substrate and the oxide layer. This structure can reduce the electron mobility in graphene because the carriers are affected by the materials above and below the graphene. The electron mobility can depend on the substrate and dielectric material. While electrons in graphene on silicon dioxide can have an electron mobility of 3,300 square centimeters per V per second ($cm^2/V \cdot s$), graphene over boron nitride can have an electron mobility of 24,000 $cm^2/V \cdot s$ and freestanding graphene can have an electron mobility of 200,000 $cm^2/V \cdot s$. However, when an insulating material is deposited over the graphene to fabricate a field effect transistor (FET), the electron mobility can decrease in some cases to only a few hundred $cm^2/V \cdot s$, which is even less than the electron mobility in silicon.

Fabricating dielectric insulated graphene FETs while maintaining the high mobility of the graphene can be challenging. Embodiments of the subject invention address this issue by reversing the regular transistor structure and saving graphene from being disposed between the substrate and the oxide layer and instead leaving it disposed or suspended over the desired regions. This structure can provide gate control over the channel while maintaining high electron mobility. At the gated region, the graphene can be disposed over the oxide while on the ungated regions, graphene can be suspended on air. Suspending the graphene is not necessary, but can increase mobility. A transistor with this structure can reach high mobility values with the proper graphene treatment.

In the past, resonant sensing has been observed only at cryogenic temperatures as electron mobility is high enough at low temperatures to sustain resonant plasmonic excitation at the channel of the detector. Only high electron mobility semiconductor field effect transistors have been able to sustain resonant plasmonic detection. Although room temperature detection has been attempted and achieved, the detectors have very small responsivity with non-resonant behavior because the graphene is disposed between the substrate and oxide layer and fabrication of such detectors in large scale is prohibitive with the methods used.

In an embodiment, a method to excite plasmons independent of the incident angle is provided. By redesigning the gate, source, and drain geometry, structures can be fabricated that can sustain plasmonic excitation at every incident angle (for example, by using circular geometries). These structures are shown in the figures.

A single detector can serve as pixel of an imaging system. The pixels can be fabricated in one-dimensional (1D) and two-dimensional (2D) arrays for any desired resolution, for example 1920×1080. The current highest resolution of commercially available THz cameras is about 320×256.

Dispersion properties of uniform grating gate THz plasmonic crystals, asymmetric dual grating gate plasmonic crystals, and those with symmetry-breaking defect-like cavities can be characterized in order to understand the physics behind THz plasmons. The dispersion of plasmons can be defined in terms of effective plasmonic index. Embodiments of the subject invention include adding another grating on top of the grating gate with a different periodicity, which can double the amount of absorption and allow excitation of the plasmons when the incident polarization is perpendicular to the gate. In other embodiments of the subject invention, one or more grating lenses can be used to provide polarization independent focusing of THz plasmons into a $\lambda/180$ area.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein are incorporated by reference in their entirety, including all figures and tables, to the extent they are not inconsistent with the explicit teachings of this specification.

What is claimed is:

1. A terahertz sensor, comprising:
a substrate;
a gate disposed on the substrate;
an insulation layer disposed on the gate and the substrate;
a source terminal and a drain terminal disposed on the substrate; and
a graphene layer disposed on the insulation layer, the graphene layer having a lower surface and an upper surface opposite from the upper surface,
the lower surface of the graphene layer being in direct physical contact with the insulation layer,
the graphene layer comprising a gate portion that is disposed directly over the gate, and
the upper surface of the entire gate portion of the graphene layer being exposed.

2. The terahertz sensor according to claim 1, the insulation layer comprising an air gap, the graphene layer being in direct physical contact with the insulation layer at the gate portion thereof, and the graphene layer being disposed over the air gap at a portion of the graphene layer that is not disposed over the gate.

3. The terahertz sensor according to claim 1, the insulation layer comprising an air gap disposed at a side of the gate, and the graphene layer being in direct physical contact with the insulation layer at the gate portion thereof.

4. The terahertz sensor according to claim 1, the graphene layer being further disposed on the source terminal.

5. The terahertz sensor according to claim 4, the graphene layer being further disposed on the drain terminal.

6. The terahertz sensor according to claim 1, the graphene layer being further disposed on the drain terminal.

7. The terahertz sensor according to claim 1, the graphene layer being further disposed between the substrate and the source terminal.

8. The terahertz sensor according to claim 7, the graphene layer being further disposed between the substrate and the drain terminal.

9. The terahertz sensor according to claim 8, the graphene layer being further disposed between the insulation layer and the source terminal, and the graphene layer being further disposed between the insulation layer and the drain terminal.

10. The terahertz sensor according to claim 1, the terahertz sensor having a quality factor (Q) of greater than 400 and a responsivity of at least 400 Volts per Watt.

11. A terahertz sensor, comprising:
a substrate;
a plurality of gates disposed on the substrate;
an insulation layer disposed on the plurality of gates and the substrate;
a source terminal and a drain terminal disposed on the substrate; and
a graphene layer disposed on the insulation layer over each gate of the plurality of gates, the graphene layer having a lower surface and an upper surface opposite from the upper surface,
the lower surface of the graphene layer being in direct physical contact with the insulation layer,
the graphene layer comprising gate portions that are respectively disposed directly over the gates of the plurality of gates, and
the upper surface of each entire gate portion of the graphene layer being exposed.

12. The terahertz sensor according to claim 11, the insulation layer comprising a plurality of air gaps,
the graphene layer being in direct physical contact with the insulation layer at the gate portions thereof, and
the graphene layer being disposed over the air gaps of the plurality of air gaps at portions of the graphene layer that are not disposed over any gate of the plurality of gates.

13. The terahertz sensor according to claim 11, the insulation layer comprising a plurality of air gaps, each air gap of the plurality of air gaps disposed at a side of a gate of the plurality of gates, and the graphene layer being in direct physical contact with the insulation layer at the gate portions thereof.

14. The terahertz sensor according to claim 11, the graphene layer being further disposed on the source terminal.

15. The terahertz sensor according to claim 14, the graphene layer being further disposed on the drain terminal.

16. The terahertz sensor according to claim 11, the graphene layer being further disposed between the substrate and the source terminal.

17. The terahertz sensor according to claim 16, the graphene layer being further disposed between the substrate and the drain terminal.

18. The terahertz sensor according to claim 17, the graphene layer being further disposed between the insulation layer and the source terminal, and the graphene layer being further disposed between the insulation layer and the drain terminal.

19. The terahertz sensor according to claim 11, the terahertz sensor having a quality factor (Q) of greater than 400 and a responsivity of at least 400 Volts per Watt.

20. A terahertz sensor, comprising:
a substrate;
a plurality of gates disposed on the substrate;
an insulation layer disposed on the plurality of gates and the substrate;
a source terminal and a drain terminal disposed on the substrate; and
a graphene layer disposed on the insulation layer over each gate of the plurality of gates, the graphene layer having a lower surface and an upper surface opposite from the upper surface,
the graphene layer being in direct physical contact with the insulation layer,
the insulation layer comprising a plurality of air gaps, each air gap of the plurality of air gaps disposed at a side of a gate of the plurality of gates,
the graphene layer being in direct physical contact with the insulation layer at gate portions thereof respectively disposed directly over the gates of the plurality of gates,
the graphene layer being disposed over the air gaps of the plurality of air gaps at portions of the graphene layer that are not disposed over any gate of the plurality of gates,
the graphene layer being further disposed in direct physical contact with the source terminal, either on a top surface of the source terminal or between the source terminal and the substrate,
the graphene layer being further disposed in direct physical contact with the drain terminal, either on a top surface of the drain terminal or between the drain terminal and the substrate,
the terahertz sensor having a quality factor (Q) of greater than 400 and a responsivity of at least 400 Volts per Watt, and
the upper surface of each entire gate portion of the graphene layer being exposed.

* * * * *